(12) United States Patent
Kawasaki et al.

(10) Patent No.: US 11,185,950 B2
(45) Date of Patent: *Nov. 30, 2021

(54) CU BALL, OSP-TREATED CU BALL, CU CORE BALL, SOLDER JOINT, SOLDER PASTE, FORMED SOLDER, AND METHOD FOR MANUFACTURING CU BALL

(71) Applicant: Senju Metal Industry Co., Ltd., Tokyo (JP)

(72) Inventors: Hiroyoshi Kawasaki, Tokyo (JP); Daisuke Soma, Tochigi (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/769,426

(22) PCT Filed: Dec. 4, 2018

(86) PCT No.: PCT/JP2018/044572
§ 371 (c)(1),
(2) Date: Jun. 3, 2020

(87) PCT Pub. No.: WO2019/111898
PCT Pub. Date: Jun. 13, 2019

(65) Prior Publication Data
US 2020/0298349 A1 Sep. 24, 2020

(30) Foreign Application Priority Data

Dec. 6, 2017 (JP) .............................. JP2017-234210

(51) Int. Cl.
*B23K 35/30* (2006.01)
*C22C 9/00* (2006.01)
(Continued)

(52) U.S. Cl.
CPC ............ *B23K 35/302* (2013.01); *B23K 35/02* (2013.01); *C22C 9/00* (2013.01); *C22C 9/06* (2013.01); *B23K 2103/12* (2018.08)

(58) Field of Classification Search
None
See application file for complete search history.

(56) References Cited

U.S. PATENT DOCUMENTS 4,726,859 A 2/1988 Hosoda et al.
9,278,409 B2 3/2016 Kawasaki et al.
(Continued)

FOREIGN PATENT DOCUMENTS

CN 102016088 A 4/2011
CN 103151091 A 6/2013
(Continued)

*Primary Examiner* — Devang R Patel
(74) *Attorney, Agent, or Firm* — The Webb Law Firm

(57) ABSTRACT

Provided are a Cu ball, an OSP-treated Cu ball, a Cu core ball, a solder joint, solder paste, and formed solder, which realize high sphericity and low hardness and in which discoloration is suppressed. An electronic component is configured by joining a solder bump of a semiconductor chip and an electrode of a printed circuit board with solder pastes The solder bump formed by joining a Cu ball to an electrode of the semiconductor chip. The Cu ball has a purity of 99.995% by mass or more and 99.9995% by mass or less, a total content of at least one element selected from Fe, Ag, and Ni of 5.0 ppm by mass or more and 50.0 ppm by mass or less, a content of S of 1.0 ppm by mass or less, and a content of P of less than 3.0 ppm by mass.

9 Claims, 1 Drawing Sheet

(51) Int. Cl.
*B23K 35/02* (2006.01)
*C22C 9/06* (2006.01)
*B23K 103/12* (2006.01)

(56) References Cited

U.S. PATENT DOCUMENTS

| | | | |
|---|---|---|---|
| 9,476,134 B2 | 10/2016 | Shindo et al. | |
| 10,147,695 B2 | 12/2018 | Kawasaki et al. | |
| 10,384,314 B2 | 8/2019 | Wakano | |
| 2009/0272466 A1* | 11/2009 | Shindo | C22B 15/0089 |
| | | | 148/432 |
| 2013/0140084 A1* | 6/2013 | Sarangapani | C22C 9/06 |
| | | | 174/94 R |
| 2013/0142567 A1* | 6/2013 | Sarangapani | C22F 1/08 |
| | | | 403/272 |
| 2015/0209912 A1* | 7/2015 | Kawasaki | B23K 35/26 |
| | | | 174/126.2 |
| 2015/0217409 A1* | 8/2015 | Akagawa | H01B 1/02 |
| | | | 174/126.2 |
| 2015/0313025 A1 | 10/2015 | Kawasaki et al. | |
| 2017/0182600 A1 | 6/2017 | Kawasaki et al. | |
| 2017/0246711 A1 | 8/2017 | Kawasaki et al. | |
| 2018/0056451 A1 | 3/2018 | Wakano | |
| 2018/0237901 A1 | 8/2018 | Mori et al. | |

FOREIGN PATENT DOCUMENTS

| | | |
|---|---|---|
| CN | 104846419 A | 8/2015 |
| CN | 105392580 A | 3/2016 |
| CN | 106029260 A | 10/2016 |
| CN | 106257978 A | 12/2016 |
| JP | H117830 A | 1/1999 |
| JP | 2005036301 A | 2/2005 |
| JP | 5435182 B1 | 3/2014 |
| JP | 5576004 B1 | 8/2014 |
| JP | 5585751 B1 | 9/2014 |
| KR | 1020150091999 A | 8/2015 |
| TW | 201544225 A | 12/2015 |
| WO | 2014087514 A1 | 6/2014 |
| WO | 2015114770 A1 | 8/2015 |
| WO | 2016170904 A1 | 10/2016 |
| WO | 2017033694 A1 | 2/2017 |

\* cited by examiner

[FIG. 1]
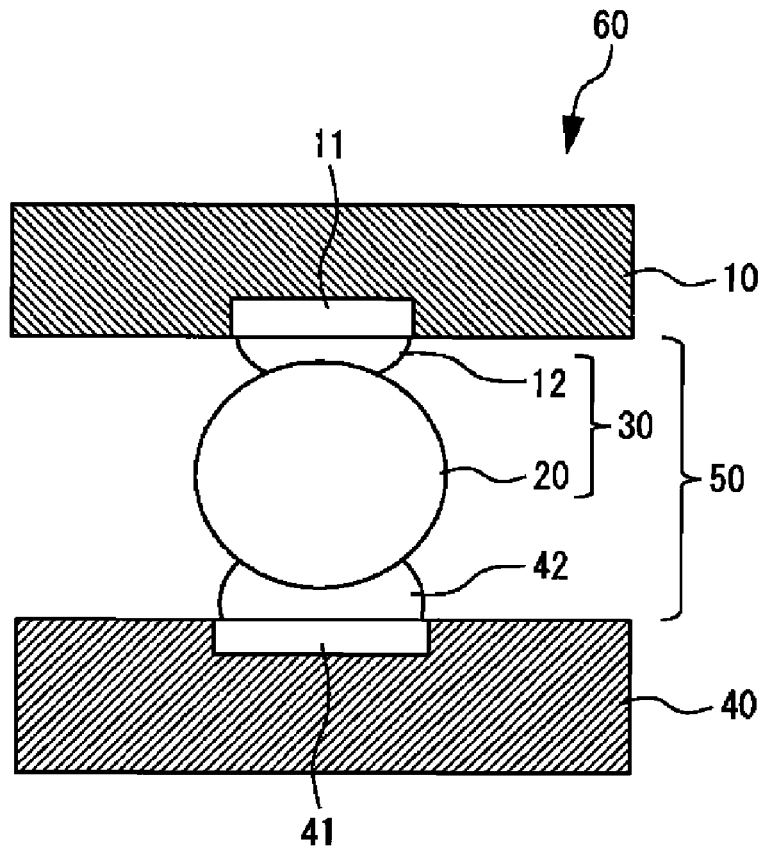
[FIG. 2]
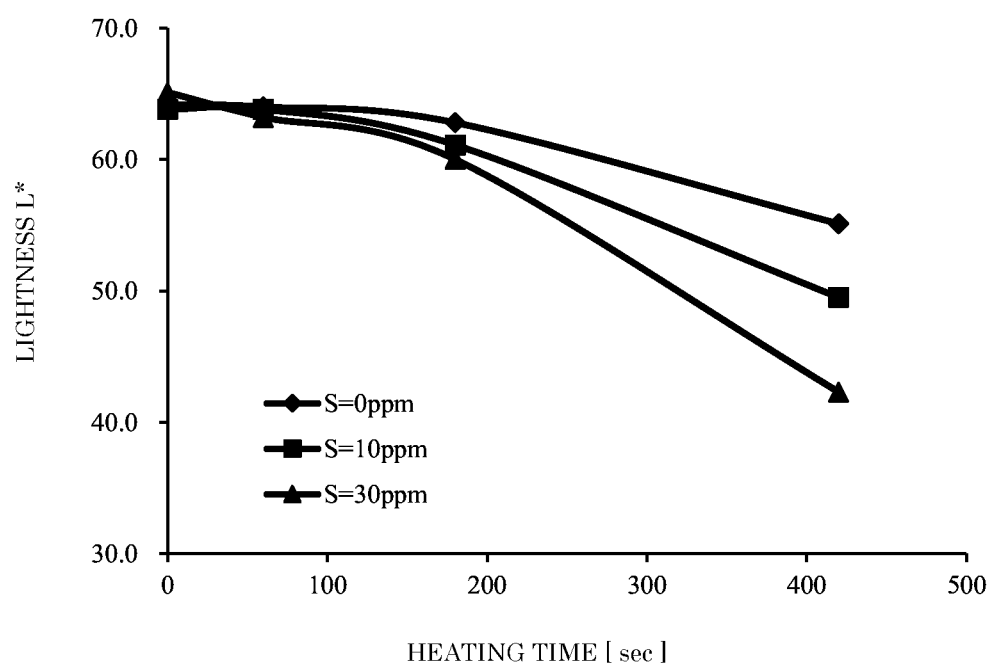

CU BALL, OSP-TREATED CU BALL, CU CORE BALL, SOLDER JOINT, SOLDER PASTE, FORMED SOLDER, AND METHOD FOR MANUFACTURING CU BALL

CROSS-REFERENCE TO RELATED APPLICATIONS

This application is the United States national phase of International Application No. PCT/JP2018/044572 filed Dec. 4, 2018, and claims priority to Japanese Patent Application No. 2017-234210 filed Dec. 6, 2017, the disclosures of which are hereby incorporated by reference in their entirety.

TECHNICAL FIELD

The present invention relates to a Cu ball, an OSP-treated Cu ball, a Cu core ball, a solder joint, solder paste, formed solder, and a method for manufacturing a Cu ball.

BACKGROUND

Recently, along development of compact information equipment, electronic components to be mounted have been downsized rapidly. A ball grid array (hereinafter referred to as "BGA") having electrodes installed at its rear surface has been applied to such electronic components in order to cope with a narrowed connection terminal and a reduced mounting area because of the downsizing requirement.

As the electronic components to which the BGA is applied, for example, a semiconductor package is exemplified. In the semiconductor package, a semiconductor chip having an electrode is sealed with a resin. A solder bump is formed on the electrode of the semiconductor chip. This solder bump is formed by joining a solder ball to the electrode of the semiconductor chip. The semiconductor package to which the BGA is applied is mounted on a printed circuit board by joining the solder bump melted by heating to a conductive land of the printed circuit board. Additionally, a three-dimensional high-density mounting structure in which the semiconductor packages are stacked up in a height direction has been studied in order to meet the further high-density mounting requirement.

Such a high-density mounting structure of the electronic components, however, may cause any soft errors in which memory contents are rewritten when α rays enter into a memory cell of a semiconductor integral circuit (IC). Accordingly, solder materials or Cu balls with low α rays, which have a decreased content of a radioisotope, have been recently developed. Patent Document 1 discloses a Cu ball with low α rays, which contains Pb and Bi and has a purity of 99.9% or more and 99.995% or less. Patent Document 2 discloses a Cu ball which has a purity of 99.9% or more and 99.995% or less, a sphericity of 0.95 or more and a Vickers hardness of 20 HV or more and 60 HV or less.

By the way, since the Vickers hardness of a Cu ball increases when its crystal grains are fine, its durability against external stress is reduced and its drop impact resistance is also deteriorated. Therefore, the Cu ball to be used for mounting the electronic components is required to have predetermined softness, i.e., a Vickers hardness equal to or less than a predetermined value.

For manufacturing a soft Cu ball, it is a general practice to increase the purity of Cu. This is because the crystal grains grow up largely when there is a small amount of impurity elements since the impurity elements function as crystal cores in the Cu ball, so that the Vickers hardness of the Cu ball decreases. When increasing the purity of the Cu ball, however, the sphericity of the Cu ball decreases.

In the case of low sphericity of the Cu ball, there is a possibility that the self-alignment property of the Cu ball cannot be secured when the Cu ball is mounted on the electrode, and unevenness in height of Cu ball may occur when mounting a semiconductor chip, thereby causing poor joints.

Patent Document 3 discloses a Cu ball which contains Cu in a ratio exceeding 99.995% by mass, has a total ratio of P and S of 3 ppm by mass or more and 30 ppm by mass or less, and has suitable sphericity and Vickers hardness.

PRIOR ART DOCUMENTS

Patent Documents

Patent Document 1: Japanese Patent No. 5435182
Patent Document 2: Japanese Patent No. 5585751
Patent Document 3: WO 2016/17904

SUMMARY

It, however, has been newly founded that a Cu ball containing at least a predetermined amount of S forms a sulfide or a sulfur oxide during heating so that it is easy to discolor. The discoloration of the Cu ball may cause the wettability thereof to deteriorate, and the deterioration of the wettability may lead to generation of a condition that is not wetted or deterioration of the self-alignment property thereof.

Therefore, the present invention provides a Cu ball, a Cu core ball, an OSP-treated Cu ball, a solder joint, solder paste, formed solder, and a method for manufacturing a Cu ball, which realize high sphericity and low hardness and in which discoloration is suppressed.

The present invention is as follows.

(1) A Cu ball having: a purity of 99.995% by mass or more and 99.9995% by mass or less; a total content of at least one element selected from Fe, Ag, and Ni of 5.0 ppm by mass or more and 50.0 ppm by mass or less; a content of S of 0 ppm by mass or more and 1.0 ppm by mass or less; and a content of P of 0 ppm by mass or more and less than 3.0 ppm by mass.

(2) A Cu ball having: a purity of 99.995% by mass or more and 99.9995% by mass or less; a total content of at least one element selected from Fe, Ag, and Ni of 5.0 ppm by mass or more and 50.0 ppm by mass or less; a content of S of 0 ppm by mass or more and 1.0 ppm by mass or less; and a content of P of 0 ppm by mass or more and less than 1.0 ppm by mass.

(3) The Cu ball according to (1) or (2), wherein the sphericity is 0.98 or more; the Vickers hardness is 55 HV or less; and the α dose is 0.0200 cph/cm$^2$ or less.

(4) The Cu ball according to (3), wherein the α dose is 0.0100 cph/cm$^2$ or less.

(5) The Cu ball according to (3) or (4), wherein the sphericity is 0.99 or more.

(6) The Cu ball according to any one of (1) to (5), wherein the Cu ball is monolayer- or multilayer-plated with at least any one of Ni, Fe, Co, Pd, Ag, and Cu.

(7) A Cu core ball comprising: the Cu ball according to any one of (1) to (6); and a solder layer coating the Cu ball.

(8) An OSP-treated Cu ball obtained by subjecting the Cu ball according to any one of (1) to (5) to Cu—OSP treatment.

(9) The Cu ball according to any one of (1) to (6), which is coated with a flux layer.

(10) The Cu core ball according to (7), which is coated with a flux layer.

(11) A solder joint using the Cu ball according to any one of (1) to (5).

(12) Solder paste using the Cu ball according to any one of (1) to (5).

(13) Formed solder using the Cu ball according to any one of (1) to (5).

(14) A method for manufacturing a Cu ball, comprising the steps of: melting a metal material; and rapidly cooling the metal material, wherein the Cu ball has a content of Cu as analyzed by ICP-MS analysis of 99.995% by mass or more and 99.9995% by mass or less; a total content of at least one element selected from Fe, Ag, and Ni of 5.0 ppm by mass or more and 50.0 ppm by mass or less; a content of S of 1.0 ppm by mass or less; and a content of P of less than 3.0 ppm by mass.

Effects of the Invention

According to the present invention, a Cu ball having high sphericity and low hardness is realized and the discoloration thereof is suppressed. The realization of high sphericity allows the self-alignment property when mounting the Cu ball on an electrode to be maintained and allows variation in height of Cu ball to be suppressed. By realizing low hardness, it is possible to improve the drop impact resistance. Further, since the discoloration of the Cu ball is suppressed, it is possible to suppress an adverse effect on the Cu ball from any sulfide or sulfur oxide, thereby improving the wettability.

BRIEF DESCRIPTION OF THE DRAWINGS

FIG. 1 is a view showing a configuration example of an electronic component using a Cu ball according to the present invention.

FIG. 2 is a graph showing the relationship between lightness and heating time when Cu balls of the Executed Examples and the Comparison Examples are heated at 200° C.

DETAILED DESCRIPTION

Hereinafter, the present invention will be described in more detail. In addition, units (ppm by mass, ppb by mass and % by mass) relating to the composition of the Cu ball represent ratios to the mass of the Cu ball unless otherwise specified.

FIG. 1 shows a configuration example of an electronic component 60 in which a semiconductor chip 10 is mounted on a printed circuit board 40 using a Cu ball 20 according to the prevent invention. As shown in FIG. 1, the Cu ball 20 is mounted on an electrode 11 of the semiconductor chip 10 via solder paste 12. In this example, a structure in which the Cu ball 20 is mounted on the electrode 11 of the semiconductor chip 10 is called a solder bump 30. Solder paste 42 is printed on an electrode 41 of the printed circuit board 40. The solder bump 30 of the semiconductor chip 10 is joined onto the electrode 41 of the printed circuit board 40 via the solder paste 42. In this example, a structure in which the solder bump 30 is mounted on the electrode 41 of the printed circuit board 40 is called a solder joint 50.

The Cu ball 20 is characterized in that: the purity is 99.995% by mass or more and 99.9995% by mass or less; the total content of at least one element selected from Fe, Ag, and Ni is 5.0 ppm by mass or more and 50.0 ppm by mass or less; the content of S is 0 ppm by mass or more and 1.0 ppm by mass or less; and the content of P is 0 ppm by mass or more and less than 3.0 ppm by mass. (Hereinafter, 99.9% by mass is referred to as 3N; 99.99% by mass is referred to as 4N, 99.995% by mass is referred to as 4N5; 99.9995% by mass is referred to as 5N5; and 99.9999% by mass is 6N, herein.) Preferably, the Cu ball 20 has a sphericity of 0.98 or more, a Vickers hardness of 55 HV or less, and an α dose of 0.0200 cph/cm² or less. A preferred embodiment of the Cu ball 20 will be described below.

<Purity of Cu Ball: 99.995% by Mass or More and 99.9995% by Mass or Less>

The Cu ball 20 having lower purity generally has higher sphericity, because it can contain impurity elements which form crystal cores of the Cu ball 20. The Cu ball 20, when having a purity of 4N5 or more and 5N5 or less, can secure sufficient sphericity.

When manufacturing the Cu ball 20, a Cu material, as an example of metal materials, formed into a predetermined shaped chip is melted by heating. The molten Cu then becomes a spherical form with its surface tension. It is solidified by rapid cooling to form the Cu ball 20. In a process of solidifying the molten Cu from its liquid state, a crystal grain grows up in the molten Cu of the spherical form. In this process, if there are a lot of impurity elements, they form crystal cores and prevent the crystal grain from growing. Accordingly, the molten Cu with the spherical form forms the Cu ball 20 having high sphericity with the fine crystal grains of which growth is suppressed. On the other hand, if less impurity elements are present, the crystal cores are relatively less formed. So, the crystal grains grow up in a certain direction without suppressing the grain growth. As a result, a part of the surface of the molten Cu with the spherical form protrudes and solidifies, resulting in low sphericity of the Cu ball. It is conceivable that the impurity elements may be Fe, Ag, Ni, P, S, Sb, Bi, Zn, Al, As, Cd, Pb, In, Sn, Au, U, Th, and the like.

Thus, the purity of the Cu ball 20 constituting the present invention is preferably 4N5 or more and 5N5 or less. In addition, when the purity of the Cu ball 20 is 4N5 or more and 5N5 or less, the α dose can be sufficiently decreased and the degradation of the electrical conductivity and thermal conductivity of the Cu ball 20 due to the reduced purity can also be suppressed.

<Total Content of at Least One Element Selected from Fe, Ag, and Ni: 5.0 ppm by Mass or More and 50.0 ppm by Mass or Less>

It is preferable that the total content of at least one element selected from the impurity elements contained in the Cu ball 20, particularly from Fe, Ag, and Ni, be 5.0 ppm by mass or more and 50.0 ppm by mass or less. That is, the contents of Fe, Ag, and Ni are each preferably 0 ppm by mass or more and 50.0 ppm by mass or less. Since Fe, Ag, and Ni form crystal cores during melting in the manufacturing process for the Cu ball 20, the Cu ball 20 having high sphericity can be manufactured if the Cu contains a predetermined amount of Fe, Ag or Ni. Therefore, at least one element selected from Fe, Ag, and Ni is an important element for estimating the contents of impurity elements. In addition, when the total content of at least one element selected from Fe, Ag, and Ni is adjusted to 5.0 ppm by mass or more and 50.0 ppm by mass or less, it is possible to suppress discoloration of the Cu ball 20 and to realize any desired Vickers hardness of the Cu ball 20, even without performing any annealing step to recrystallize the Cu ball slowly through slow heating and subsequent gradual cooling of the Cu ball.

<Content of S: 0 ppm by Mass or More and 1.0 ppm by Mass or Less>

The Cu ball containing at least a predetermined amount of S forms a sulfide or a sulfur oxide during heating and easily discolors, and the wettability thereof deteriorates. So, the content of S is required to be 0 ppm by mass or more and 1.0 ppm by mass or less. As the amount of the sulfide or the sulfur oxide formed on the Cu ball increases, the lightness of the surface of the Cu ball decreases. Therefore, when a measurement result of the lightness of the surface of the Cu ball indicates a predetermined value or less, it can be determined that the formation of the sulfide or the sulfur oxide is suppressed and that the wettability thereof is good, which will be described later.

<Content of P: 0 ppm by Mass or More and Less Than 3.0 ppm by Mass>

P may be changed to phosphoric acid or may form a Cu complex, so that it may have an adverse effect on the Cu ball. Since the Cu ball containing a predetermined amount of P has high hardness, the content of P is preferably 0 ppm by mass or more and less than 3.0 ppm by mass, more preferably less than 1.0 ppm by mass.

<Sphericity of Cu Ball: 0.98 or More>

In the present invention, the sphericity represents a gap from a true sphere. The sphericity is an arithmetic mean value calculated by dividing the diameter of each of 500 Cu balls by the length of the longest axis of each Cu ball. When the sphericity value is closer to the upper limit 1.00, the Cu ball is closer to the true sphere. The sphericity is determined by various kinds of methods, for example, a least squares center method (LSC method), a minimum zone center method (MZC method), a maximum inscribed center method (MIC method), a minimum circumscribed center method (MCC method), and the like. In the present invention, the length of the longest axis and the length of the diameter refer to lengths measured by measuring equipment, ultra-quick vision, ULTRA QV 350-PRO manufactured by Mitsutoyo Corporation.

The Cu ball 20 has a sphericity of preferably 0.98 or more, more preferably 0.99 or more, from the viewpoint of maintaining an appropriate space between the substrates. When the sphericity of the Cu ball 20 is less than 0.98, the Cu ball 20 becomes an indeterminate shape. Therefore, bumps having uneven heights are formed at the bump formation time and the possibility that poor joints may occur is increased. Furthermore, when reflow is performed in a state where the Cu ball 20 is mounted on the electrode, the Cu ball 20 is displaced, and the self-alignment property is also deteriorated. If the sphericity is 0.98 or more, it is possible to ensure the self-alignment property when the Cu ball 20 is mounted on the electrode 11 of the semiconductor chip 10 and also to suppress variation in height in the solder joint 50 because the Cu ball 20 is not melted at the soldering temperature. Therefore, it is possible to surely prevent poor joints between the semiconductor chip 10 and the printed circuit board 40 from occurring.

<Vickers Hardness: 55.5 HV or Less>

The Vickers hardness of the Cu ball 20 is preferably 55.5 HV or less. In the case where the Vickers hardness is high, the durability against external stress becomes low, so that the drop impact resistance gets worse and cracks are generated easily. Also, in the case where the auxiliary force such as pressurization is applied when forming three-dimensional mounting bumps and joints, there is a possibility that a crash of electrode and the like may occur with the use of a hard Cu ball. Moreover, in the case where the Vickers hardness of the Cu ball 20 is high, a crystal grain becomes smaller than a certain size and therefore, the deterioration of the electrical conductivity may be caused. When the Vickers hardness of the Cu ball 20 is 55.5 HV or less, the drop impact resistance is satisfactory, cracks can be suppressed, a crash of electrode and the like can be suppressed, and the degradation of the electrical conductivity can also be suppressed. In this Example, the lower limit of the Vickers hardness may be more than 0 HV, preferably 20 HV or more.

<Alpha (α) Dose: 0.0200 cph/cm² or Less>

The α dose of the Cu ball 20 is preferably 0.0200 cph/cm² or less so as to suppress soft errors in the high-density mounting of the electronic components to an insignificant level. The α dose is more preferably 0.0010 cph/cm² or less from the viewpoint of suppressing soft errors in higher-density mounting. In order to suppress soft errors caused by the α dose, the contents of radioactive isotopes such as U and Th are preferably less than 5 ppb by mass.

<Discoloring Resistance: Lightness of 55 or More>

The Cu ball 20 preferably has a lightness of 55 or more. The lightness is the "L*" value" of the L*a*b* color space. Since the Cu ball 20, on the surface of which a sulfide or a sulfur oxide derived from S is formed, has lower lightness, it is estimated that the formation of the sulfide or the sulfur oxide is sufficiently suppressed when the lightness is 55 or more. In addition, the Cu ball 20 having a lightness of 55 or more has excellent wettability when the Cu ball 20 is mounted. On the contrary, when the Cu ball 20 has a lightness of less than 55, it is estimated that the formation of the sulfide or the sulfur oxide is not sufficiently suppressed. The sulfide or the sulfur oxide has an adverse effect on the Cu ball 20 and its wettability deteriorates when the Cu ball 20 is directly joined onto the electrode. The deterioration of the wettability may lead to generation of a condition that is not wetted or deterioration of the self-alignment property thereof.

<Diameter of Cu Ball: 1 μm or More and 1000 μm or Less>

The diameter of the Cu ball 20 is preferably 1 μm or more and 1000 μm or less, more preferably 50 μm or more and 300 μm or less. If the diameter falls within this range, the spherical Cu ball 20 can be stably manufactured. Moreover, a shorted connection can be suppressed when a pitch between the terminals is narrow. Here, in the case where the Cu ball 20 is used for solder paste, a collection of "Cu balls" can be called as "Cu powder". In the case where the Cu ball is used for the Cu powder, it is preferable that the diameter of the Cu ball be generally 1 to 300 μm.

<Other Impurity Elements>

The contents of impurity elements such as Sb, Bi, Zn, Al, As, Cd, Pb, In, Sn, and Au, other than the above-described impurity elements, contained in the Cu ball 20 (hereinafter, referred to as "other impurity elements") are each preferably 0 ppm by mass or more and less than 50.0 ppm by mass.

The Cu ball according to the present invention can also be composed of a Cu ball 20 and a plating layer (metal layer) which is made of one or more elements selected from Ni, Fe, and Co and coats the Cu ball 20.

<Cu Core Ball>

Also, the surface of the Cu ball 20 is coated with a metal layer made of a single metal or an alloy, so that a Cu core ball composed of the Cu ball 20 and the metal layer can be formed. For example, the Cu core ball can be composed of the Cu ball 20 and a solder layer (metal layer) coating the surface of the Cu ball 20. The composition of the solder layer constituting the solder layer is not particularly limited so long as it may be solder alloy composition that includes Sn as the main component, in the case of an alloy. In addition, as the solder layer, a Sn plating film may be used. For example, Sn, Sn—Ag alloy, Sn—Cu alloy, Sn—Ag—Cu alloy, Sn—In alloy, and products obtained by adding predetermined alloy element(s) thereto are exemplified. In every case, the content of Sn is 40% by mass or more. As the alloy element to be added, for example, Ag, Cu, In, Ni, Co, Sb, Ge, P, Fe, Bi, Pb, and the like are exemplified. Among them, the alloy composition of the solder layer is preferably Sn—3Ag—0.5Cu alloy from the viewpoint of the drop impact resistance. Solder having low α dose may be used in the solder layer to form a Cu core ball having low α dose. The thickness of the solder layer is not particularly limited, but is sufficiently 100 μm or less, more preferably 20 to 50 μm on one side only. The sphericity of the Cu core ball, which is composed of the Cu ball 20 and the solder layer coating the surface of the Cu ball 20, is preferably 0.98 or more.

The Cu ball 20 monolayer- or multilayer-plated with at least any one of Ni, Fe, Co, Pd, Ag, and Cu may be coated with a metal layer made of a single metal or an alloy to form a Cu core ball. Also, in this case, the metal layer may be a solder layer. By forming the Cu core ball having such a configuration, the diffusion of Cu into the solder can be reduced at the time of joining to the electrode, and the thinning of copper of the Cu ball 20 can be suppressed. The thickness of the plating layer of Ni or the like is generally 0.1 to 20 μm on one side.

<OSP-Treated Cu Ball>

The surface of the Cu ball 20 may be coated with an organic coating containing an imidazole compound (hereinafter referred to as "OSP coating") to form an OSP (Organic Solderability Preservative)-treated Cu ball. For the OSP coating, Tough Ace F2 (manufactured by Shikoku Chemicals Corporation) can be used as a treatment liquid.

<Flux-Coated Cu Ball, Flux-Coated Cu Core Ball>

The surface of the Cu ball 20 may be coated with a flux to produce a flux-coated Cu ball having a flux layer. Furthermore, the surface of the Cu core ball may be coated with a flux to produce a flux-coated Cu core ball having a flux layer. As the flux, rosins (polymerized rosin, rosin ester, hydrogenated rosin, acid-modified rosin), organic acids (such as glutaric acid), amine compounds, organic halides, and the like can be used.

The above-described flux layer is composed of one or more components including a compound which acts as an activator that prevents oxidation of the metal surface of the Cu ball 20, the solder layer, or the like and removes the metal oxide film at the time of soldering. For example, the flux layer may be composed of a plurality of components including a compound acting as an activator and a compound acting as an activator adjuvant.

As the activator constituting the flux layer, any of an amine, an organic acid, and a halogen, a combination of two or more amines, a combination of two or more organic acids, or a combination of two or more halogens, a combination of one or more amines, organic acids and halogens is added, depending on the characteristics required in the present invention.

As the activator adjuvant constituting the flux layer, any of an ester, an amide and an amino acid, a combination of two or more esters, a combination of two or more amides, a combination of two or more amino acids, or a combination of one or more esters, amides, and amino acids is added, depending on the characteristics of the activator.

Further, the flux layer may contain a rosin or a resin in order to protect, for example, the compound acting as an activator from heat during reflow. Furthermore, the flux layer may contain a resin for fixing, for example, the compound acting as an activator to the solder layer.

The flux layer may be composed of a single layer made of a single compound or a plurality of compounds. Also, the flux layer may be composed of a plurality of layers made of a plurality of compounds. The component constituting the flux layer adheres to the surface of the solder layer in a solid state, but in the step of causing the flux to adhere to the solder layer, the flux needs to be liquid or gaseous.

For this reason, the component constituting the flux layer needs to be soluble in a solvent, for coating with a solution. For example, if a salt is formed, a component which becomes insoluble in a solvent will exist. Due to the presence of the component which becomes insoluble in the liquid flux, uniform adsorption becomes difficult in the flux containing a poorly soluble component such as the precipitate formed. For this reason, conventionally, it is not possible to form a liquid flux by mixing a compound that forms a salt.

On the other hand, in the case of flux-coated Cu balls and flux-coated Cu core balls coated with a flux layer, it is possible to form flux layers, one by one, into a solid state and to form a multilayer flux layer. Thus, even when a compound forming a salt, which is a component which cannot be mixed in a liquid flux, is used, a flux layer can be formed.

The surface of the Cu ball 20 or Cu core ball, which is easily oxidized, is coated with the flux layer acting as an activator, so that the oxidation of the surface of the Cu ball 20 and the surface of the solder layer or metal layer of the Cu core ball can be suppressed, for example, during storage.

Here, since the colors of the flux and the metal are generally different, and the colors of the Cu ball 20 or the like and the flux layer are also different, it is possible to confirm the amount of the flux to be adsorbed based on the color saturation, for example, lightness, yellowness or redness. In addition, a dye may be mixed with the compound constituting the flux layer for the purpose of coloring.

<Solder Paste, Formed Solder, Solder Joint>

Also, solder paste can be configured by incorporating the Cu ball 20 or the Cu core ball in solder. Formed solder can be configured by dispersing the Cu ball 20 or the Cu core ball in solder. The Cu ball 20 or the Cu core ball can also be used for forming a solder joint for joining the electrodes.

<Method for Manufacturing Cu Ball>

Then, an example of a method for manufacturing the Cu ball 20 will be described. As an example of the metal material, the Cu material is put on a heat-resistant plate (hereinafter, referred to as "heat-resistant plate") made of ceramics or the like and is heated in a furnace together with the heat-resistant plate. Many dimples each having a hemispheric bottom are provided in the heat-resistant plate. The diameter and depth of each of the dimples are suitably set according to the diameter of the Cu ball 20. For example, the diameter of each of the dimples is 0.8 mm and the depth thereof is 0.88 mm. Further, the Cu materials each having a chip shape, which are obtained by cutting a fine wire made of Cu, are put into the dimples one by one in the heat-resistant plate. The heat-resistant plate in which the Cu material has been put into each of the dimples is heated at 1100 to 1300° C. in the furnace filled with ammonia decomposition gas, and is subjected to heating treatment for 30 to 60 minutes. At this time, when the temperature in the furnace is not lower than the melting point of Cu, the Cu material is melted so that it has a spherical shape. Thereafter, the interior of the furnace is cooled and the Cu ball 20 is molded by being cooled rapidly in each of the dimples of the heat-resistant plate.

Further, as other methods, there are an atomizing method in which molten Cu is dropped down from an orifice pierced in the bottom of a melting pot and the droplet is rapidly cooled to room temperature (25° C., for example) to be sphered as the Cu ball 20 and a method in which thermal plasma heats a cut metal of Cu to a temperature of 1000° C. or higher to form the Cu ball 20.

In the method for manufacturing the Cu ball 20, the Cu material as a raw material of the Cu ball 20 may be heated at 800 to 1000° C. before formation of the Cu ball 20.

As the Cu material as a raw material of the Cu ball 20, for example, a nugget material, a wire material, a plate material, or the like can be used. The Cu material may have a purity of 4N5 or more and 6N or less from the viewpoint of preventing the purity of the Cu ball 20 from being decreased too much.

In the case of using a Cu material having such high purity, the retention temperature of the molten Cu may be lowered to approximately 1000° C., as in a conventional way, without performing the heating treatment described above. Thus, the above-described heating treatment may be appropriately omitted or changed according to the α dose or the purity of the Cu material. In addition, in the case where a Cu ball 20 having high α dose or a deformed Cu ball 20 has been manufactured, such a Cu ball 20 may be reused as a raw material so that the α dose can be further decreased.

EXECUTED EXAMPLES

Executed Examples of the present invention will be descried below, but the present invention is not limited thereto. Cu balls were produced in the Executed Examples, and their sphericity, Vickers hardness, α dose and discoloring resistance were measured. The measurement results are indicated in Tables 1 and 2. In the following tables, numerals without any units represent ppm by mass or ppb by mass. Particularly, numerical values indicating the content ratios of Fe, Ag, Ni, P, S, Sb, Bi, Zn, Al, As, Cd, Pb, In, Sn, and Au in the tables represent ppm by mass. Numerical values indicating the content ratios of U and Th in the tables represent ppb by mass. The "total content of impurities" indicates the total content ratio of impurity elements contained in each of the Cu balls. The mark "<1" indicates that the content ratio of the corresponding impurity element to the Cu ball is less than 1 ppm by mass. The mark "<5" indicates that the content ratio of the corresponding impurity element to the Cu ball is less than 5 ppb by mass.

<Manufacturing of Cu Ball>

Conditions for producing the Cu balls were examined. A nugget material was prepared as a Cu material which is an example of the metal material. Cu materials having a purity of 6N were used in Executed Examples 1 to 10 and 19 and Comparison Examples 1 to 12. Cu materials having a purity of 4N5 were used in Executed Examples 11 to 18. Each Cu material was put into a melting pot and then, the melting pot was heated up to a temperature of 1200° C. This heating treatment was performed for 45 minutes to melt the Cu material. The molten Cu was dropped down from an orifice pierced in the bottom of the melting pot. The generated droplets were rapidly cooled to room temperature (18° C.) so as to be sphered as the Cu balls. Thus, the Cu balls each having the mean diameter indicated in the following tables were produced. The element analysis can be performed with high accuracy using Inductively-coupled Plasma Mass Spectrometry (ICP-MS analysis) or Glow Discharge Mass Spectrometry (GD-MS analysis). In the Examples, ICP-MS analysis was used for the analysis. A method for evaluating each of the sphericity, the Vickers hardness, the α dose, and the discoloring resistance will be described in detail.

<Sphericity>

The sphericity was measured by a CNC image measurement system. The equipment used was ultra-quick vision, ULTRA QV 350-PRO manufactured by Mitsutoyo Corporation.

[Criteria for Evaluation of Sphericity]

In each of the following tables, the criteria for evaluation of the sphericity were as follows.

The symbol "⊚" indicates that the sphericity was 0.99 or more;

The symbol "○" indicates that the sphericity was 0.98 or more and less than 0.99; and The symbol "x" indicates that the sphericity was less than 0.98.

<Vickers Hardness>

The Vickers hardness of each of the Cu balls was measured in accordance with "Vickers Hardness Test-Test method JIS Z2244". The equipment used was micro Vickers hardness testing machine, AKASHI micro hardness tester MVK-F 12001-Q manufactured by AKASHI Corporation.

[Criteria for Evaluation of Vickers Hardness]

In each of the following tables, the criteria for evaluation of the Vickers hardness were as follows.

The symbol "○" indicates that the Vickers hardness was more than 0 HV to 55.5 HV or less; and The symbol "x" indicates that the Vickers hardness exceeded 55.5 HV.

<Alpha (α) Dose>

The method for measuring the α dose is as follows. An α-ray measuring device of a gas-flow proportional counter was used to measure the α dose. A measurement sample was a 300 mm×300 mm flat shallow container with the Cu balls being bedded on the bottom thereof so that the bottom could not be seen. The measurement sample was placed in the α-ray measuring device and allowed to stand for 24 hours under PR-10 gas flow, and then the α dose was measured.

[Criteria for Evaluation of α Dose]

In each of the following tables, the criteria for evaluation of the α dose were as follows.

The symbol "○" indicates that the α dose was 0.0200 cph/cm$^2$ or less; and

The symbol "x" indicates that the α dose exceeded 0.0200 cph/cm$^2$.

In addition, the PR-10 gas (argon 90% and methane 10%) used for the measurement was one which was kept for a period of three weeks or longer since a gas cylinder was filled with the PR-10 gas. The reason for using the cylinder after the lapse of 3 weeks or longer is because the measurement was made in accordance with the JEDEC STANDARD-Alpha Radiation Measurement in Electronic Materials JESD221, as defined by the JEDEC (Joint Electron Device Engineering Council), so as to prevent the generation of α rays by radon in the atmosphere entering the gas cylinder.

<Discoloring Resistance>

In order to measure the discoloring resistance, the Cu balls were heated at 200° C. for 420 seconds using a thermostat oven under the atmosphere and were measured for an alteration of lightness. They were evaluated on whether or not they could satisfactorily endure aging variation. The lightness was determined from the color value (L*, a*, b*) by measuring spectral transmittance with the use of CM-3500d Spectrophotometer manufactured by Konica Minolta, following JIS Z 8722 (Methods of color measurement-Reflecting and transmitting objects) using D65 light source with 10 degrees field of view. It is to be noted that the color value (L*, a*, b*) is stipulated in JIS Z 8729 (Color specification-CIELAB and CIELUV color spaces). L* indicates lightness, a* indicates redness, and b* indicates yellowness.

[Criteria for Evaluation of Discoloring Resistance]

In each of the following tables, the criteria for evaluation of the discoloring resistance were as follows.

The symbol "○" indicates that the lightness after 420 seconds was 55 or more; and The symbol "x" indicates that the lightness after 420 seconds was less than 55.

<Total Evaluation>

The Cu balls which were evaluated as "○" or "○○" in the methods of and criteria for evaluation of all of the sphericity, the Vickers hardness, the α dose, and the discoloring resistance were evaluated as "○" in their total evaluations. On the other hand, the Cu balls which were evaluated as "x" for any one of the sphericity, the Vickers hardness, the α dose and the discoloring resistance were evaluated as "x" in their total evaluations.

TABLE 1

| ELEMENT | EXECUTED EXAMPLE 1 | EXECUTED EXAMPLE 2 | EXECUTED EXAMPLE 3 | EXECUTED EXAMPLE 4 | EXECUTED EXAMPLE 5 | EXECUTED EXAMPLE 6 | EXECUTED EXAMPLE 7 |
|---|---|---|---|---|---|---|---|
| Cu | Bal | Bal | Bal | Bal | Bal | Bal | Bal |
| Fe | 5.0 | 10.0 | 50.0 | <1 | <1 | <1 | <1 |
| Ag | <1 | <1 | <1 | 5.0 | 10.0 | 50.0 | <1 |
| Ni | <1 | <1 | <1 | <1 | <1 | <1 | 5.0 |
| Fe + Ag + Ni | 5.0 | 10.0 | 50.0 | 5.0 | 10.0 | 50.0 | 5.0 |
| S | <1 | <1 | <1 | <1 | <1 | <1 | <1 |
| P | <1 | <1 | <1 | <1 | <1 | <1 | <1 |
| Sb | <1 | <1 | <1 | <1 | <1 | <1 | <1 |
| Bi | <1 | <1 | <1 | <1 | <1 | <1 | <1 |
| Zn | <1 | <1 | <1 | <1 | <1 | <1 | <1 |
| Al | <1 | <1 | <1 | <1 | <1 | <1 | <1 |
| As | <1 | <1 | <1 | <1 | <1 | <1 | <1 |
| Cd | <1 | <1 | <1 | <1 | <1 | <1 | <1 |
| Pb | <1 | <1 | <1 | <1 | <1 | <1 | <1 |
| Sn | <1 | <1 | <1 | <1 | <1 | <1 | <1 |
| In | <1 | <1 | <1 | <1 | <1 | <1 | <1 |
| Au | <1 | <1 | <1 | <1 | <1 | <1 | <1 |
| U | <5 | <5 | <5 | <5 | <5 | <5 | <5 |
| Th | <5 | <5 | <5 | <5 | <5 | <5 | <5 |
| TOTAL AMOUNT OF IMPURITIES | 5.0 | 10.0 | 50.0 | 5.0 | 10.0 | 50.0 | 5.0 |
| DIAMETER φ | 300 μm | 300 μm | 300 μm | 300 μm | 300 μm | 300 μm | 300 μm |
| SPHERICITY | ○○ | ○○ | ○○ | ○○ | ○○ | ○○ | ○○ |
| VICKERS HARDNESS | ○ | ○ | ○ | ○ | ○ | ○ | ○ |
| ALPHA DOSE | ○ | ○ | ○ | ○ | ○ | ○ | ○ |
| DISCOLORING RESISTANCE | ○ | ○ | ○ | ○ | ○ | ○ | ○ |
| TOTAL EVALUATION | ○ | ○ | ○ | ○ | ○ | ○ | ○ |

| ELEMENT | EXECUTED EXAMPLE 8 | EXECUTED EXAMPLE 9 | EXECUTED EXAMPLE 10 | EXECUTED EXAMPLE 11 | EXECUTED EXAMPLE 12 | EXECUTED EXAMPLE 13 | EXECUTED EXAMPLE 14 |
|---|---|---|---|---|---|---|---|
| Cu | Bal | Bal | Bal | Bal | Bal | Bal | Bal |
| Fe | <1 | <1 | 5.0 | 1.7 | 1.7 | 2.5 | 2.3 |
| Ag | <1 | <1 | 6.0 | 10.1 | 9.3 | 9.5 | 10.7 |
| Ni | 40.0 | 60.0 | 8.0 | 3.8 | 4.2 | 0.8 | 1.2 |
| Fe + Ag + Ni | 40.0 | 50.0 | 15.0 | 18.6 | 15.2 | 12.8 | 14.2 |
| S | <1 | <1 | <1 | <1 | <1 | <1 | <1 |
| P | <1 | <1 | <1 | <1 | <1 | <1 | <1 |
| Sb | <1 | <1 | <1 | <1 | <1 | <1 | <1 |
| Bi | <1 | <1 | <1 | <1 | <1 | <1 | <1 |
| Zn | <1 | <1 | <1 | <1 | <1 | <1 | <1 |
| Al | <1 | <1 | <1 | <1 | <1 | <1 | <1 |
| As | <1 | <1 | <1 | <1 | <1 | <1 | <1 |
| Cd | <1 | <1 | <1 | <1 | <1 | <1 | <1 |
| Pb | <1 | <1 | <1 | <1 | <1 | <1 | <1 |
| Sn | <1 | <1 | <1 | <1 | <1 | <1 | <1 |
| In | <1 | <1 | <1 | <1 | <1 | <1 | <1 |
| Au | <1 | <1 | <1 | <1 | <1 | <1 | <1 |
| U | <5 | <5 | <5 | <5 | <5 | <5 | <5 |
| Th | <5 | <5 | <5 | <5 | <5 | <5 | <5 |
| TOTAL AMOUNT OF IMPURITIES | 10.0 | 50.0 | 15.0 | 15.6 | 15.2 | 12.8 | 14.2 |
| DIAMETER φ | 300 μm | 300 μm | 300 μm | 300 μm | 300 μm | 300 μm | 300 μm |
| SPHERICITY | ○○ | ○○ | ○○ | ○○ | ○○ | ○○ | ○○ |
| VICKERS HARDNESS | ○ | ○ | ○ | ○ | ○ | ○ | ○ |
| ALPHA DOSE | ○ | ○ | ○ | ○ | ○ | ○ | ○ |

TABLE 1-continued

| | | | | | | | |
|---|---|---|---|---|---|---|---|
| DISCOLORING RESISTANCE | ○ | ○ | ○ | ○ | ○ | ○ | ○ |
| TOTAL EVALUATION | ○ | ○ | ○ | ○ | ○ | ○ | ○ |

| ELEMENT | EXECUTED EXAMPLE 15 | EXECUTED EXAMPLE 16 | EXECUTED EXAMPLE 17 | EXECUTED EXAMPLE 18 | EXECUTED EXAMPLE 19 |
|---|---|---|---|---|---|
| Cu | Bal | Bal | Bal | Bal | Bal |
| Fe | 2.3 | 2.3 | 2.3 | 5.8 | 5.5 |
| Ag | 10.7 | 10.7 | 10.7 | <1 | 10.1 |
| Ni | 1.2 | 1.2 | 1.2 | <1 | 5.7 |
| Fe + Ag + Ni | 14.2 | 14.3 | 14.2 | 5.8 | 21.3 |
| S | <1 | <1 | <1 | <1 | <1 |
| P | <1 | <1 | <1 | <1 | 2.9 |
| Sb | <1 | <1 | <1 | <1 | <1 |
| Bi | <1 | <1 | <1 | <1 | <1 |
| Zn | <1 | <1 | <1 | <1 | <1 |
| Al | <1 | <1 | <1 | <1 | <1 |
| As | <1 | <1 | <1 | <1 | <1 |
| Cd | <1 | <1 | <1 | <1 | <1 |
| Pb | <1 | <1 | <1 | 13.2 | <1 |
| Sn | <1 | <1 | <1 | 30.3 | <1 |
| In | <1 | <1 | <1 | <1 | <1 |
| Au | <1 | <1 | <1 | <1 | <1 |
| U | <5 | <5 | <5 | <5 | <5 |
| Th | <5 | <5 | <5 | <5 | <5 |
| TOTAL AMOUNT OF IMPURITIES | 14.2 | 14.2 | 14.2 | 49.3 | 24.2 |
| DIAMETER φ | 200 μm | 100 μm | 50 μm | 50 μm | 300 μm |
| SPHERICITY | ○○ | ○○ | ○○ | ○○ | ○○ |
| VICKERS HARDNESS | ○ | ○ | ○ | ○ | ○ |
| ALPHA DOSE | ○ | ○ | ○ | ○ | ○ |
| DISCOLORING RESISTANCE | ○ | ○ | ○ | ○ | ○ |
| TOTAL EVALUATION | ○ | ○ | ○ | ○ | ○ |

TABLE 2

| ELEMENT | COMPARISON EXAMPLE 1 | COMPARISON EXAMPLE 2 | COMPARISON EXAMPLE 3 | COMPARISON EXAMPLE 4 | COMPARISON EXAMPLE 5 | COMPARISON EXAMPLE 6 |
|---|---|---|---|---|---|---|
| Cu | Bal | Bal | Bal | Bal | Bal | Bal |
| Fe | <1 | <1 | <1 | <1 | <1 | <1 |
| Ag | <1 | <1 | <1 | <1 | <1 | <1 |
| Ni | <1 | <1 | <1 | <1 | <1 | <1 |
| Fe + Ag + Ni | 0.0 | 0.0 | 0.0 | 0.0 | 0.0 | 0.0 |
| S | 10.0 | 15.0 | 20.0 | 25.0 | 30.0 | 35.0 |
| P | <1 | <1 | <1 | <1 | <1 | <1 |
| Sb | <1 | <1 | <1 | <1 | <1 | <1 |
| Bi | <1 | <1 | <1 | <1 | <1 | <1 |
| Zn | <1 | <1 | <1 | <1 | <1 | <1 |
| Al | <1 | <1 | <1 | <1 | <1 | <1 |
| As | <1 | <1 | <1 | <1 | <1 | <1 |
| Cd | <1 | <1 | <1 | <1 | <1 | <1 |
| Pb | <1 | <1 | <1 | <1 | <1 | <1 |
| Sn | <1 | <1 | <1 | <1 | <1 | <1 |
| In | <1 | <1 | <1 | <1 | <1 | <1 |
| Au | <1 | <1 | <1 | <1 | <1 | <1 |
| U | <5 | <5 | <5 | <5 | <5 | <5 |
| Th | <5 | <5 | <5 | <5 | <5 | <5 |
| TOTAL AMOUNT OF IMPURITIES | 10.0 | 15.0 | 20.0 | 25.0 | 30.0 | 35.0 |
| DIAMETER φ | 300 μm | 300 μm | 300 μm | 300 μm | 300 μm | 300 μm |
| SPHERICITY | ○ | ○○ | ○○ | ○○ | ○○ | ○○ |
| VICKERS HARDNESS | ○ | ○ | ○ | ○ | ○ | ○ |
| ALPHA DOSE | ○ | ○ | ○ | ○ | ○ | ○ |
| DISCOLORING RESISTANCE | X | X | X | X | X | X |
| TOTAL EVALUATION | X | X | X | X | X | X |

TABLE 2-continued

| ELEMENT | COMPARISON EXAMPLE 7 | COMPARISON EXAMPLE 8 | COMPARISON EXAMPLE 9 | COMPARISON EXAMPLE 10 | COMPARISON EXAMPLE 11 | COMPARISON EXAMPLE 12 |
|---|---|---|---|---|---|---|
| Cu | Bal | Bal | Bal | Bal | Bal | Bal |
| Fe | <1 | 50.0 | 4.2 | 52.0 | 5.7 | 1.2 |
| Ag | <1 | 50.0 | 29.1 | 51.7 | 30.5 | <1 |
| Ni | <1 | 50.0 | 14.7 | 49.9 | 12.3 | <1 |
| Fe + Ag + Ni | 0.0 | 150.0 | 48.0 | 153.6 | 48.5 | <1 |
| S | <1 | <1 | <1 | <1 | <1 | <1 |
| P | <1 | <1 | 211.5 | 10.2 | 199.9 | <1 |
| Sb | <1 | <1 | 23.3 | 20.5 | <1 | <1 |
| Bi | <1 | <1 | 51.9 | 17.9 | <1 | <1 |
| Zn | <1 | 13.0 | 5.7 | <1 | <1 | <1 |
| Al | <1 | <1 | <1 | <1 | <1 | <1 |
| As | <1 | <1 | 51.2 | <1 | <1 | <1 |
| Cd | <1 | <1 | 6.5 | <1 | <1 | <1 |
| Pb | <1 | 11.2 | 31.4 | <1 | <1 | <1 |
| Sn | <1 | 151.0 | 58.7 | <1 | <1 | <1 |
| In | <1 | <1 | <1 | <1 | <1 | <1 |
| Au | <1 | <1 | <1 | <1 | <1 | <1 |
| U | <5 | <5 | <5 | <5 | <5 | <5 |
| Th | <5 | <5 | <5 | <5 | <5 | <5 |
| TOTAL AMOUNT OF IMPURITIES | 0.0 | 325.2 | 488.2 | 202.2 | 248.4 | 1.2 |
| DIAMETER $\phi$ | 300 μm | 300 μm | 300 μm | 300 μm | 300 μm | 300 μm |
| SPHERICITY | X | ◯◯ | ◯◯ | ◯◯ | ◯◯ | X |
| VICKERS HARDNESS | ◯ | X | X | X | X | ◯ |
| ALPHA DOSE | ◯ | ◯ | ◯ | ◯ | ◯ | ◯ |
| DISCOLORING RESISTANCE | ◯ | ◯ | ◯ | ◯ | ◯ | ◯ |
| TOTAL EVALUATION | X | X | X | X | X | X |

As indicated in Table 1, the Cu balls of the Executed Examples in which the purity was 4N5 or more and 5N5 or less, all exhibited good results in their total evaluations. This suggests that the purity of the Cu ball is preferably 4N5 or more and 5N5 or less.

As in Executed Examples 1 to 9, the Cu balls having a purity of 4N5 or more and 5N5 or less and containing 5.0 ppm by mass or more and 50.0 ppm by mass or less of Fe, Ag, or Ni exhibited good results in their total evaluations. As seen in Executed Examples 10 to 19, the Cu balls having a purity of 4N5 or more and 5N5 or less and containing 5.0 ppm by mass or more and 50.0 ppm by mass or less, in total, of Fe, Ag, and Ni also exhibited good results in their total evaluations. In addition, though not indicated in the tables, the Cu balls in which the content of Fe was changed to 0 ppm by mass or more and less than 5.0 ppm by mass, the content of Ag was changed to 0 ppm by mass or more and less than 5.0 ppm by mass, and the content of Ni was changed to 0 ppm by mass or more and less than 5.0 ppm by mass, from those of Executed Examples 1 and 15 to 19, and the total content of Fe, Ag, and Ni was 5.0 ppm by mass or more also exhibited good results in their total evaluations.

As shown in Executed Example 18, the Cu ball of this Example containing Fe, Ag, and Ni in a total amount of 5.0 ppm by mass or more and 50.0 ppm by mass or less and containing the other impurity elements such as Sb, Bi, Zn, Al, As, Cd, Pb, In, Sn and Au, respectively, in an amount of 50.0 ppm by mass or less also exhibited good results in its total evaluation.

On the other hand, as for the Cu ball of Comparison Example 7, the total content of Fe, Ag, and Ni was less than 5.0 ppm by mass, the contents of U and Th were less than 5 ppb by mass, and the contents of the other impurity elements were also less than 1 ppm by mass. The sphericity was less than 0.98. In addition, the Cu ball of Comparison Example 12 in which the total content of at least one element selected from Fe, Ag, and Ni was less than 5.0 ppm by mass though it contained an impurity element, also had a sphericity of less than 0.98. From these results, it is understood that Cu balls in which the total content of at least one element selected from Fe, Ag, and Ni is less than 5.0 ppm by mass cannot realize high sphericity.

The Cu ball of Comparison Example 10 containing Fe, Ag, and Ni in a total amount of 153.6 ppm by mass and the other impurity elements, respectively, in an amount of 50 ppm by mass or less had a Vickers hardness exceeding 55.5 HV, and it did not exhibit any good results. The Cu ball of Comparison Example 8 containing Fe, Ag, and Ni in a total amount of 150.0 ppm by mass and the other impurity elements in an amount of largely exceeding 50.0 ppm by mass, particularly Sn in an amount of 151.0 ppm by mass, had a Vickers hardness exceeding 55.5 HV, and it did not also exhibit any good results. Therefore, it is understood that, when Cu balls have a purity of 4N5 or more and 5N5 or less but contain at least one element selected from Fe, Ag, and Ni in a total amount exceeding 50.0 ppm by mass, the Cu balls has high Vickers hardness, thereby failing to realize low hardness. In addition, it is understood that the Cu ball preferably contains the other impurity elements, respectively, in an amount of not exceeding 50.0 ppm by mass.

From these results, it is understood that a Cu ball having a purity of 4N5 or more and 5N5 or less and containing at least one element selected from Fe, Ag, and Ni in a total amount of 5.0 ppm by mass or more and 50.0 ppm by mass or less realizes high sphericity and low hardness, and that the discoloration thereof is suppressed. It is preferable that the contents of the other impurity elements be respectively 50.0 ppm by mass or less.

The Cu balls of Executed Examples 14 to 17 had the same composition but different diameters. They all exhibited good results in their total evaluations. Though not indicated in the tables, the Cu balls having the same composition as those of the Executed Examples and having a diameter of 1 μm or more and 1000 μm or less, all exhibited good results in their total evaluations. Therefore, it is understood that the diameter of the Cu ball is preferably 1 μm or more and 1000 μm or less, more preferably 50 μm or more and 300 μm or less.

The Cu ball of Executed Example 19 containing Fe, Ag, and Ni in a total amount of 5.0 ppm by mass or more and 50.0 ppm by mass or less and P in an amount of 2.9 ppm by mass exhibited good results in its total evaluation. The Cu ball of Comparison Example 11 containing Fe, Ag, and Ni in a total amount of 50.0 ppm by mass or less, similarly to the Cu ball of Executed Example 19, had a Vickers hardness exceeding 55.5 HV, so that it exhibited results different from those of the Cu ball of Executed Example 19. The Cu ball of Comparison Example 9 also had a Vickers hardness exceeding 55.5 HV. This would be because the Cu balls of Comparison Examples 9 and 11 contain a significantly large amount of P. From this result, it is understood that when increasing the content of P, the Vickers hardness becomes high. Therefore, it is understood that the content of P is preferably less than 3 ppm by mass, more preferably less than 1 ppm by mass.

The Cu balls of the Executed Examples exhibited an α dose of 0.0200 cph/cm² or less. Therefore, when using the Cu balls of the Examples in the high-density mounting of the electronic components, they can suppress occurrence of any soft errors.

The Cu ball of Comparison Example 7 exhibited good results about the discoloring resistance while the Cu balls of Comparison Examples 1 to 6 did not exhibit any good results about the discoloring resistance. When comparing each of the Cu balls of Comparison Examples 1 to 6 with the Cu ball of Comparison Example 7, their compositions were different only in the content of S. Therefore, it is understood that in order to obtain a good result of the discoloring resistance, the content of S may be required to be less than 1 ppm by mass. Because the Cu balls of all of the Executed Examples contained less than 1 ppm by mass of S, it is understood that the content of S is preferably less than 1 ppm by mass.

Subsequently, in order to confirm the relationship between the content of S and the discoloring resistance, the Cu balls of Executed Example 11 and Comparison Examples 1 and 5 were heated at 200° C. and photographed before the heating, after the heating for 60 seconds, after the heating for 180 seconds, and after the heating for 420 seconds to measure the lightness. Table 3 indicates the relationship between the period of time when the Cu balls were heated and the lightness, and FIG. 2 shows a graph of this relationship.

TABLE 3

| No. | Ini | 200° C.-HEATING TIME [sec] | | |
|---|---|---|---|---|
| | 0 | 60 | 180 | 420 |
| EXECUTED EXAMPLE 11 | 64.2 | 64.0 | 62.8 | 55.1 |
| COMPARISON EXAMPLE 1 | 63.8 | 63.8 | 61.1 | 49.5 |
| COMPARISON EXAMPLE 5 | 65.1 | 63.2 | 60.0 | 42.3 |

From Table 3, when comparing the lightness of the Cu balls before the heating with the lightness of the Cu balls after the heating for 420 seconds, the lightness of each of the Cu balls of Executed Example 11 and Comparison Examples 1 and 5 exhibited values near 64 or 65 before the heating. After the heating for 420 seconds, however, the Cu ball of Comparison Example 5 containing 30.0 ppm by mass of S exhibited the lowest lightness, the Cu ball of Comparison Example 1 containing 10.0 ppm by mass of S exhibited the second lowest lightness, and the Cu ball of Executed Example 11 containing less than 1 ppm by mass of S exhibited the third lowest lightness. Therefore, it is understood that the higher the content of S is, the lower the lightness after the heating is. Since the Cu balls of Comparison Examples 1 and 5 exhibited a lightness below 55, it is understood that a Cu ball containing 10.0 ppm by mass or more of S forms a sulfide or a sulfur oxide during heating, and it is easy to discolor. Moreover, it is understood that when the Cu ball contains 0 ppm by mass or more and 1.0 ppm by mass or less of S, the formation of the sulfide or the sulfur oxide is suppressed, and the wettability thereof is improved. It is to be noted that when mounting the Cu ball of Executed Example 11 on the electrode, the Cu ball exhibited good wettability.

The Cu balls of the Executed Examples having a purity of 4N5 or more and 5N5 or less, containing at least one element selected from Fe, Ag, and Ni in a total amount of 5.0 ppm by mass or more and 50.0 ppm by mass or less, and containing S in an amount of 0 ppm by mass or more and 1.0 ppm by mass or less and P in an amount of 0 ppm by mass or more and less than 3.0 ppm by mass, all exhibited a sphericity of 0.98 or more, thereby realizing high sphericity. The realization of the high sphericity allows the self-alignment property when mounting the Cu ball on the electrode or the like to be maintained and allows variation in height of Cu ball to be suppressed. The Cu balls of the Executed Examples all exhibited a Vickers hardness of 55 HV or less, and thus realized low hardness. By realizing the low hardness, it is possible to improve the drop impact resistance of the Cu ball. In addition, the discoloration was suppressed in all of the Cu balls of the Executed Examples. By suppressing the discoloration of the Cu ball, it is possible to suppress an adverse effect of the sulfide or the sulfur oxide on the Cu ball and to improve the wettability when it is mounted on the electrode.

In addition, the column Executed Example 1 in Table 1 indicates addition of 5.0 ppm by mass or more and 50.0 ppm by mass or less of Fe to the Cu material whose purity is 6N. In this case, the purity of the Cu material is 99.9999% by mass or more, and the content of the impurities is less than 1 ppm by mass in the whole Cu material.

Further, for example, when a 6N material is used as the Fe material, similarly to the Cu material, the content of the impurity derived from Fe also becomes less than 1 ppm by mass in the whole Fe material. Even when a 4N material is used as a common Fe material, the content of impurities is less than 100 ppm by mass in the whole iron material. Therefore, in this case, it is understood that, even if 50 ppm by mass (=0.0050% by mass), which is the maximum amount of the Fe material to be added, is added to the Cu material, only 0.5 ppm by mass (0.0050×100 ppm by mass), i.e., less than 1 ppm by mass of the impurity can be contained in the Cu material.

Furthermore, the content of each of the impurities other than Fe, Ag, and Ni is also lower than the detection limit value and is less than 1 ppm by mass, as indicated in Executed Example 1 in Table 1 above.

Therefore, when a high-purity Cu material is used, a Cu ball having a purity of 99.995% by mass or more can be obtained even if the total content of at least one element selected from Fe, Ag, and Ni is 50.0 ppm by mass and the other impurities are added.

In addition, although the Cu nugget material having a purity of 4N5 or more and 6N or less was used as the Cu material of the Executed Examples, good results were acquired in the total evaluation even if a wire material, a plate material, or the like having a purity of 4N5 or more and 6N or less was used.

The technical scope of the present invention can also be applied to forms of Cu column, pillar, or pellet having the above-described features of the present invention.

DESCRIPTION OF CODES

10 Semiconductor chip
11, 41 Electrode
12, 42 Solder paste
20 Cu ball
30 Solder bump
40 Printed circuit board
50 Solder joint
60 Electronic component

The invention claimed is:

1. A Cu ball, comprising:
   a purity of more than 99.995% by mass and 99.9995% by mass or less;
   a total content of at least one element selected from Fe, Ag, and Ni of 5.0 ppm by mass or more and 50.0 ppm by mass or less;
   a content of S of 0 ppm by mass or more and 1.0 ppm by mass or less; and
   a content of P of 0 ppm by mass or more and less than 3.0 ppm by mass,
   wherein the sphericity is 0.98 or more,
   wherein the Vickers hardness is 55 HV or less, and
   wherein the α dose is 0.0200 cph/cm$^2$ or less.

2. The Cu ball according to claim 1, wherein the content of P is 0 ppm by mass or more and less than 1.0 ppm by mass.

3. The Cu ball according to claim 1, wherein the α dose is 0.0100 cph/cm$^2$ or less.

4. The Cu ball according to claim 1, wherein the sphericity is 0.99 or more.

5. The Cu ball according to claim 1, wherein the Cu ball is monolayer- or multilayer-plated with at least any one of Ni, Fe, Co, Pd, Ag, and Cu.

6. A Cu core ball, comprising:
   the Cu ball according to claim 1; and
   a solder layer coating the Cu ball.

7. A Cu core ball, comprising:
   the Cu ball according to claim 1, wherein the Cu ball is monolayer- or multilayer-plated with at least any one of Ni, Fe, Co, Pd, Ag, and Cu; and
   a solder layer coating the Cu ball.

8. The Cu core ball according to claim 7, wherein the α dose is 0.0100 cph/cm$^2$ or less.

9. The Cu core ball according to claim 7, wherein the sphericity is 0.99 or more.

* * * * *